United States Patent

Kita et al.

[11] 4,123,276
[45] Oct. 31, 1978

[54] PHOTOSENSITIVE COMPOSITION

[75] Inventors: Nobuyuki Kita; Yasuhisa Narutomi, both of Odawara, Japan

[73] Assignees: Fuji Photo Film Co., Ltd., Kanagawa, Japan; National Patent Development Corporation, New York, N.Y.

[21] Appl. No.: 760,371

[22] Filed: Jan. 18, 1977

Related U.S. Application Data

[63] Continuation of Ser. No. 551,106, Feb. 20, 1975, abandoned.

[30] Foreign Application Priority Data

Feb. 28, 1974 [JP] Japan .................................. 49-23940

[51] Int. Cl.$^2$ .............................................. G03C 1/52
[52] U.S. Cl. ................................ 96/91 R; 96/115 R; 96/115 P; 96/86 P; 96/35.1
[58] Field of Search ................ 96/115 R, 115 P, 35.1, 96/91, 36.3, 75, 27 R, 86 P

[56] References Cited

U.S. PATENT DOCUMENTS

| | | | |
|---|---|---|---|
| 3,060,023 | 10/1962 | Burg et al. ................................ | 96/28 |
| 3,418,295 | 12/1968 | Schoenthaler .................... | 260/80.72 |
| 3,732,105 | 5/1973 | Klupfel et al. ..................... | 96/115 P |
| 3,778,270 | 12/1973 | Roos ........................................ | 96/75 |
| 3,790,382 | 2/1974 | Dahlman ................................. | 96/75 |
| 3,841,874 | 10/1974 | Nishino ................................ | 96/27 R |

*Primary Examiner*—John D. Welsh
*Attorney, Agent, or Firm*—Cushman, Darby & Cushman

[57] ABSTRACT

A photosensitive composition is prepared comprising (a) a copolymer having an acid value of 10 to 100 and containing structural units represented by the following general formula I

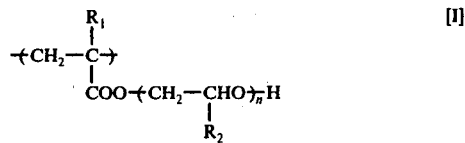

where $R_1$ represents a hydrogen atom or methyl group, $R_2$ represents a hydrogen atom, methyl group, ethyl group or chloromethyl group, and $n$ is an integer of from 1 to 10, inclusive, and structural units represented by the following general formula II

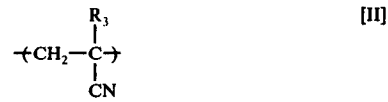

where, in the formula, $R_3$ represents a hydrogen atom or methyl group, and
(b) a diazo compound and, optionally,
(c) a resin having hydrophilic groups.

21 Claims, No Drawings

PHOTOSENSITIVE COMPOSITION

This is a continuation, of application Ser. No. 551,106 filed Feb. 20, 1975 now abandoned.

This invention relates to a photosensitive composition and, more particularly, to a diazo compound-containing photosensitive composition suitably used for the preparation of photosensitive planographic plates.

Most of the photosensitive materials which have been employed in presensitized plates for the preparation of printing plates are diazonium compounds among which the most commonly used are diazo resins represented by condensates of p-diazodiphenylamine with formaldehyde. Such diazo resins are commercially available, e.g., under the trade name of DIAZOLYS #1 (Ringwood Chemical Corp.) and of DIAZO RESIN #4 (Fairmount Chemical Corp.). When such a diazo resin is applied to a paper, plastic sheet, metallic plate or like suitable support and exposed through a negative transparency to actinic light rays, the exposed part of the diazo resin is insolubilized due to the decomposition of the diazo resin. On the other hand, in unexposed areas, the diazo resin remains unchanged and can be washed away by water to lay bare the surface of the support. When there is used a support having a surface which has previously been subjected to a treatment to render it hydrophilic, the unexposed areas lay bare the hydrophilic surface on development. On an offset printing machine, the hydrophilic areas attract water and repel inks. The decomposed and insolubilized diazo resin exerts oleophilic properties, repelling water and attracting inks. That is to say, such printing materials provide printing plates of so-called negaposi type.

The photosensitive compositions used in this type of photosensitive printing materials may be divided into two groups: one comprising a diazo resin alone or, in other words, not containing any carrier, and the other comprising a mixture of a diazo resin and a carrier. In the former case, it is necessary to reinforce the image since the thickness of the photosensitive layer in terms of coating weight is about 20 to about 100 mg/m$^2$. Because of the lack of carrier and the image obtained it is poor in abrasion resistance and printing durability. Accordingly, usually, an emulsion lacquer is selectively applied, concurrently with or subsequent to the developing step to the image area to impart to it sufficient strength to endure frictional, scratching and other injuring forces which the image will encounter during printing and thereby to make it possible to produce numerous sheets of printed matter. The lacquer to be used for this purpose should be such that it is adherent to the image area to give a coating film having excellent abrasion resistance and having no tendency to yield to scum or gum. Various types of lacquer have been disclosed, e.g., in Hall, U.S. Pat. No. 2,754,279. However, this process requires the user of printing materials to be sufficiently skilled in application of the lacquer because the performance of a printing plate depends greatly on whether the lacquer is applied well or poorly. For the purpose of eliminating such drawbacks it has been previously proposed to incorporate a resin having a good abrasion resistance together with a photosensitive compound into a photosensitive layer and to cure or harden the incorporated resin by the action of the photodecomposed diazonium compound, as disclosed in U.S. Pat. No. 2,826,501 and British Pat. No. 1,074,392. In this process a resin corresponding to the aforesaid lacquer is blended with a diazo resin and the blend is applied to a support in a weight sufficient to form a coating layer having, from the first, a sufficient thickness, i.e., about 0.5 to 5 g/m$^2$, and in the developing step, the unnecessary areas, i.e., uncured areas are removed from the surface of the support by taking advantage of the difference in solubility between the uncured areas and cured areas to obtain a printing plate of a performance equal or superior to that of a printing plate prepared in the former process.

However, in the latter process, there are problems of compatibility between the resin to be incorporated and the diazo resin and the choice of common solvent for them. Furthermore, the photosensitive composition should be such that it provides a photosensitive layer which is entirely insolubilized in the exposed areas by photo-induced decomposition of the photosensitive compound or yields upon exposure a distinct difference in solubility or swellability between the exposed areas and unexposed areas. In addition, the resin to be used as a carrier should not have the property of deteriorating the stability of the diazo compound incorporated therewith. Though a certain type of water-soluble colloid forms a resist of a very good quality when used as a carrier for a diazo resin, the resist deteriorates and loses its photosensitivity within a few days by dark reaction. Several compositions which fulfill the aforementioned conditions have been proposed in the prior art but none of them fulfills all the requirements of curing rate, printing durability, oleophilic properties and storage stability.

We have hitherto disclosed a photosensitive composition satisfying such conditions, namely a photosensitive material comprising a homopolymer or copolymer of a hydroxyalkyl acrylate or methacrylate, such as of 2-hydroxyethyl methacrylate, and a diazo compound in our copending application Ser. No. 489,434 filed July 17, 1974. The entire disclosure of application Ser. No. 489,434 is hereby incorporated by reference and relied upon. Although the photosensitive material comprising a homopolymer or copolymer of 2-hydroxyethyl methacrylate and a diazo compound exhibits excellent capabilities when used as a photosensitive material for planographic plates, it has the drawback that it needs an aqueous solution containing a large amount of a wetting agent for removal of unexposed areas, i.e., for development, and that its developing rate becomes lower when applied in a thickness exceeding 1.5 g/m$^2$.

Accordingly, an object of the present invention is to provide an improved photosensitive composition.

Another object of the present invention is to provide a diazonium compound-containing photosensitive composition capable of being developed using a weak alkaline aqueous solution.

Still another object of the present invention is to provide a photosensitive composition having good storage stability and suitably useful for the preparation of presensitized plates providing planographic printing plates having the high printing durability.

A further object of the present invention is to provide a presensitized printing plate having excellent printing durability.

The photosensitive composition in accordance with the present invention comprises (a) a copolymer of an acid value of 10 to 100 containing recurring units of the following general formula I

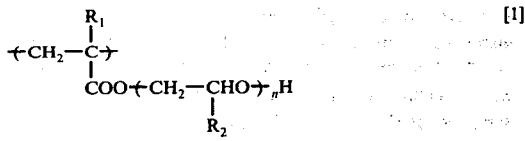

wherein $R_1$ represents a hydrogen atom or methyl group, $R_2$ represents a hydrogen atom or methyl, ethyl or chloromethyl groups, and $n$ is an integer of 1 to 10 and recurring units of the following general formula II

wherein $R_3$ represents a hydrogen atom or methyl group, and (b) a diazo compound.

In a modification, the photosensitive composition in accordance with the present invention comprises (a) a copolymer of an acid value of 10 to 100 containing recurring units of the above general formula I and recurring units of the above general formula II, (b) a diazo compound and optionally, (c) a polymer having hydrophilic groups.

The copolymer containg recurring units represented by the above general formula I and recurring units represented by the above general formula II and having an acid value of 10 to 100, to be used in the present invention includes, e.g., three-, four- or higher multi-components copolymers of a compound of the following general formula III

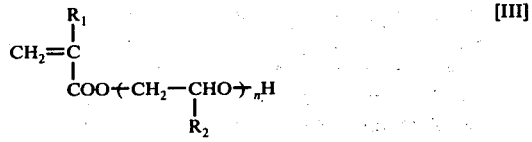

wherein $R_1$, $R_2$ and $n$ have the same meanings as designated above with respect to the general formula I, together with acrylonitrile or methacrylonitrile and an $\alpha,\beta$-ethylenically unsaturated carboxylic acid or anhydride thereof and, optionally, another addition polymerizable unsaturated compound e.g., a half esterified product of a cyclic acid anhydride with binary, ternary or higher multi-component copolymer of a compound of the above general formula III with acrylonitrile or methacrylonitrile and/or optionally, another addition copolymerizable unsaturated compound.

As the compounds represented by the above general formula III preferred are, for example, 2-hydroxyethyl acrylate, 2-hydroxypropyl acrylate, 2-hydroxybutyl acrylate, 3-chloro-2-hydroxypropyl acrylate, diethyleneglycol monoacrylate, triethyleneglycol monoacrylate, tetraethylene glycol monoacrylate, dipropyleneglycol monoacrylate, tripropyleneglycol monoacrylate, tetrapropyleneglycol monoacrylate, 2-hydroxyethyl methacrylate, 2-hydroxypropyl methacrylate, 2-hydroxybutyl methacrylate, 3-chloro-2-hydroxypropyl methacrylate, diethyleneglycol monomethacrylate, triethyleneglycol monomethacrylate, tetraethyleneglycol monomethacrylate, dipropyleneglycol monomethacrylate, tripropyleneglycol monomethacrylate tetrapropyleneglycol monomethacrylate and decaethylene glycol methacrylate.

Typical examples the the $\alpha,\beta$-unsaturated carboxylic acids and anhydrides thereof are acrylic acid, methacrylic acid, ethacrylic acid, maleic anhydride, methylmaleic anhydride, phenylmaleic anhydride, crotonic acid, itaconic acid, vinylbenzoic acid, sorbic acid, cinnamic acid, allylsulfonic acid, vinylsulfonic acid, vinylbenzenesulfonic acid, including all three isomers, i.e., ortho, meta and para, mono-2-hydroxyethyl itaconate, mono-2-hydroxypropyl itaconate, mono-2-hydroxyethyl citraconate, mono-2-hydroxyethyl aconitate, mono-2-hydroxyethyl maleate, mono-2-hydroxyethyl fumarate, monomethyl itaconate and monoethyl itaconate.

The addition polymerizable unsaturated compounds which can be used include those containing one addition polymerizable ethylenically unsaturated bond, such as acrylates, acrylamides, methacrylates, methacrylamides, allyl compounds, vinyl ethers, vinyl esters, styrenes, crotonates and the like. Examples are: acrylates, such as alkyl acrylates, e.g., methyl acrylate, ethyl acrylate, propyl acrylate, butyl acrylate, amyl acrylate, octyl acrylate, 2-ethylhexyl acrylate, tert-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate and tetrahydrofurfuryl acrylate, and aryl acrylates, e.g., phenyl acrylate; methacrylates, such as alkyl methacrylates, e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate, and aryl methacrylates, e.g., phenyl methacrylate, cresyl methacrylates, e.g., para cresyl methacrylate, and naphthyl methacrylates, e.g., alpha naphthyl methacrylates; scrylamides, such as acrylamide itself, N-alkylacrylamides wherein the alkyl is e.g., methyl, ethyl, propyl, butyl, tert-butyl, heptyl, octyl, cyclohexyl, hydroxyethyl or benzyl, N-arylacrylamides wherein the aryl is e.g., phenyl, tolyl, nitrophenyl, naphthyl or hydroxyphenyl, N,N-dialkylacrylamides wherein the alkyl is, e.g., methyl, ethyl, butyl, isobutyl, e.g., N,N-dimethylacrylamide, N,N-diethylacrylamide, N-methyl-N-propylacrylamide ethylhexyl or cyclohexyl, N,N-diarylacrylamides wherein the aryl is e.g., phenyl, e.g., N,N-diphenylacrylamide, N-methyl-N-phenylacrylamide, N-hydroxyethyl-N-methylacrylamide, N-2-acetamidethyl-N-acetylacrylamide; methacrylamides, such as methacrylamide itself, N-alkylmethacrylamides wherein the alkyl is e.g., methyl, ethyl, tert-butyl, ethylhexyl, hydroxyethyl or cyclohexyl, N-arylmethacrylamides wherein the aryl is, e.g., phenyl, N,N-dialkylmethacrylamides wherein the alkyl being, e.g., ethyl, propyl or butyl, e.g., N,N-dimethyl methacrylamide and N,N-diethyl methacrylamide, N,N-diarylmethacrylamides wherein the aryl is, e.g., phenyl, e.g., N,N-diphenyl methacrylamide, N-hydroxyethyl-N-methylmethacrylamide, N-methyl-N-phenylmethacrylamide and N-ethyl-N-phenylmethacrylamide; allyl compounds, such as allyl esters, e.g., allyl acetate, allyl caproate, allyl caprylate, allyl laurate, allyl proprionate, allyl palmitate, allyl stearate, allyl benzoate, allyl acetoacetate and allyl lactate, and allyloxyethanol; vinyl esters, such as alkyl vinyl ethers, e.g., hexyl vinyl ether, octyl vinyl ether, ethylvinyl either, methyl vinyl ether, decyl vinyl ether, ethylhexyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethyleneglycol vinyl ether, dimethylaminoethyl vinyl ether, diethylaminoethyl vinyl ether, benzyl vinyl ether and tetrahydrofurfuryl vinyl ether, and vinyl aryl ethers, e.g., vinyl phenyl ether, vinyl tolyl ethers, e.g., vinyl p-tolyl ether, vinyl chlorophenyl ethers, e.g., vinyl p-chlorophenyl ether, vinyl 2,4-dichlorophenyl ether, vinyl naphthyl ethers, e.g., vinyl beta naphthyl ether, and vinyl anthranyl ether; vinyl esters, e.g., vinyl butyrate, vinyl isobutyrate, vinyl acetate, vinyl propionate, vinyl stearate, vinyltrimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-$\beta$-phenylbutylate, vinyl chlorobenzoate, vinyl cyclohexylcarboxylate, vinyl benzoate, vinyl salicylate, vinyl tetrachlorobenzoate and vinyl naphthoate; styrenes, such as styrene itself, alkylstyrenes, e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, e.g., para chloromethyl styrene, trifluoromethylstyrene, ethoxymethylstyrene and acetoxymethylstyrene, alkoxystyrene, e.g., methoxystyrene, e.g., 4-methoxystyrene, 4-methoxy-3-methylstyrene and dimethoxystyrene, and halogenostyrenes, e.g., chlorostyrene, dichlorostyrene, e.g., 2,4-dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene; crotonates, such as alkyl crotonates, e.g. butyl crotonate, hexyl crotonate and glycerol monocrotonate; dialkyl itaconates, e.g. dimethyl itaconate, diethyl itaconate and dibutyl itaconate; and dialkyl maleates and furmarates, e.g., dimethyl maleate and dimethyl fumarate. There may be used any other addition polymerizable unsaturated compounds so far as they are copolymerizable with a compound of the above general formula III and acrylonitrile or methacrylonitrile. However, additional polymerizable compounds having a functional group capable of reacting at room temperature with the hydroxyl group contained in the 2-hydroxyethyl acrylate or methacrylate and polyfunctional addition polymerizable unsaturated compounds having two or more polymerizable vinyl or vinylidene groups in a molecule are less desirable than compounds having only one such group. The addition polymerizable unsaturated compound may be contained in the copolymer in an amount of 64 to 10, preferably 49 to 10% by weight in the case of the copolymer containing in copolymerized form an $\alpha,\beta$-unsaturated carboxylic acid, and 64 to 0, preferably 49 to 0% by weight in case of the copolymer containing no $\alpha,\beta$-unsaturated carboxylic acid units and half esterified by a cyclic acid anhydride.

The cyclic acid anhydride which is half esterified with a copolymer of a compound of the above general formula III with an acrylonitrile or methacrylonitrile and, optionally, another addition polymerizable unsaturated compound includes, e.g., phthalic anhydride, tetrahydrophthalic anhydride, hexahydrophthalic anhydride, 3,6-endomethylene-$\Delta^4$-tetrahydrophthalic anhydride, 3,6-endoxy-$\Delta^4$-tetrahydrophthalic anhydride, tetrachlorophthalic anhydride, maleic anhydride, chloromaleic anhydride, succinic anhydride and n-dodecylsuccinic anhydride.

The copolymer should have an acid value of 10 to 100, preferably of 15 to 40. Copolymers of an acid value below 10 are unpractical because they are not well developed by a weakly alkaline solution, while those having an acid value exceeding 100 result in an image area with poor oleophilicity and are unsuitable for use, especially as a photosensitive material in planographic plates.

The advantage brought about by the copolymerization of acrylonitrile or methacrylonitrile with the compound of formula III is that, though a photosensitive composition prepared by using a copolymer of a compound of the above general formula III and an $\alpha,\beta$-unsaturated carboxylic acid is severely swelled upon development with a weakly aqueous alkaline solution to give an image area having a poor abrasion resistance, this drawback can be eliminated by copolymerization therewith of either acrylonitrile or methacrylonitrile. The copolymerization of acrylonitrile or methacrylonitrile results in a planographic printing plate having a high printing durability as high as 2 to 3 times that of a printing plate prepared without copolymerization of acrylonitrile or methacrylonitrile.

The structural unit of acrylonitrile or methacrylonitrile, i.e., structural unit represented by the above general formula II, is usually contained in the component (a) polymer used in the present invention in an amount of 5 to 60, preferably of 10 to 40% by weight. A content below 5% by weight is insufficient to bring about the above advantage, while a content above 60% by weight causes a problem in solubility of the copolymer itself. The content of the structural unit represented by the above general formula I is usually 30 to 80, preferably 40 to 60% by weight. A content below 30% by weight results in an image area of a poor mechanical strength or causes a problem in developing property. On the other hand, a content above 80% by weight causes swelling of image areas on development and, in addition, deteriorates the oleophilicity of the image areas.

The copolymer used in the practice of the present invention should be of a viscosity of 1,000 to 20,000, preferably of 2,000 to 7,000, as determined in 33% solution in ethyleneglycol monomethyl ether at 25° C by means of a Brookfield rotational viscosimeter.

The copolymer may be prepared by conventional solution, suspensic or block polymerization processes, though the most preferred is the solution polymerization process. As the polymerization medium there may conveniently be used ethyleneglycol monomethyl ether, ethyleneglycol monobutyl ether, dioxane, ethanol-water, methanol-water, methyl ethyl ketone, ethanol-acetic acid and like solvents. The particular solvent is not critical. Usually mixtures of an alcohol (such as those set forth below) with another organic solvent or with water are used. An alcohol, such as methanol, ethanol, isopropanol or butanol, cannot by itself dissolve the polymerizate formed and causes gelation of the polymerization mixture. It is preferred to carry out the polymerization in a solvent capable of dissolving the polymerizate formed. The polymerization may be carried out at temperatures of 20° to 150° C. which temperature can be freely varied depending on the initiator employed. The polymerization may be effected not only by heat but also by light rays, e.g., ultraviolet light. As a photopolymerization initiator there may conveniently be used a benzoine alkyl ether, e.g., benzoin ethyl ether. Representative of the heat-induced polymerization initiators include azobis compounds, peroxides and redox catalysts; such as, e.g., azo-bis-isobutylonitrile, 2,2'-azo-bis-(2,4-dimethyl-valeronitrile), 1,1'-azo-bis-(cyclohexane-1-carbonitrile), 2,2-azo-bis-(4-methoxy-2,4-dimethylvaleronitrile), 2-phenylazo-2,4-dimethyl-4-methoxyvaleronitrile, 2-cyano-2-propylazoformamide, potassium persulfate, tert-butyl peroctoate, benzoyl peroxide, isopropyl percarbonate, 2,4-dichlorobenzoyl peroxide, methyl ethyl ketone peroxide, cumene hydroperoxide, dicumyl peroxide and the like.

The preferred content of the copolymer of the aforesaid component (a) ranges between 50 to 95, more desirably 60 to 92% by weight based on the total weight of the components (a) and (b) in the photosensitive composition.

The diazonium compound suitably used in the present invention includes diazonium salts, diazo resins represented by condensates of p-diazodiphenylamine with formaldehyde, and like substances which are photosensitive, insoluble in water and soluble in ordinary organic solvents.

It is preferable for the diazo compound to be compatible with the copolymer used in the present invention such as the copolymers mentioned above. As the diazo compound the most preferably used are compounds containing at least 2 diazo groups per molecule, such as salts of condensates of p-diazodiphenylamine with formaldehyde, e.g., phenol salt, fluorocapric acid salt and sulfonic acid salts, such as the salts of triisopropyl-naphthalenesulfonic acid, 4,4-biphenyldisulfonic acid, 5-nitro-o-toluenesulfonic acid, 5-sulfosalycilic acid, 2,5-dimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoylbenzenesulfonic acid and p-toluenesulfonic acid. Other diazo compounds which may also be used suitably are salts with the aforesaid acids of condensates of 2,5-dimethoxy-4-tolylmercaptobenzenediazonium with formaldehyde and of condensates of 2,5-dimethoxy-4-morpholinobenzenediazonium with formaldehyde, and compounds, as disclosed in Japanese Patent Application laid open to public inspection No. 33907/1973, represented by the following general formula:

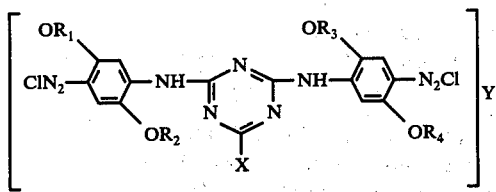

wherein:

$R_1$, $R_2$, $R_3$ and $R_4$ each represent an alkyl group containing 1 to 4 carbon atoms, such as methyl, ethyl, propyl or butyl;

X represents a substituted amino group, such as N-(beta-hydroxyethyl)amino, N,N-di(beta-hydroxyethyl)amino or like hydroxyalkylamino group; and Y represents an anion of the coupling agent as described above; examples are: 2-methoxy-4-hydroxy-5-benzoyl benzenesulfonate of 2,6-bis(4-diazo-2,5-dimethoxyphenylamino)-4-N,N-(di-beta-hydroxyethyl)amino-1,3,5-triazine, 2-methoxy-4-hydroxy-5-benzoylbenzenesulfonate of 2,6-bis(4-diazo-2,5-dimethoxyphenylamino)-4-N-(beta-hydroxyethyl)amino-1,3,5-triazine, and 2-methoxy-4-hydroxy-5-benzoylbenzenesulfonate of 2,6-bis(4-diazo-2,5-diethoxyphenylamino)-4-N-(beta-hydroxyethyl)amino-1,3,5-triazine.

Still other suitable diazo compounds are those as disclosed in Neugebauer U.S. Pat. No. 2,649,373, the entire disclosure of which is hereby incorporated by reference and relied upon.

The most preferred diazo compound is 2-methoxy-4-hydroxy-5-benzoylbenzenesulfonic acid salt of the condensate of p-diazodiphenylamine with formaldehyde.

The diazo compound preferably is incorporated in the photosensitive composition of the present invention in amounts of 50 to 5% by weight based on the total weight of the components (a) and (b). The sensitivity of the photosensitive composition increases, of course, with decrease in amount of the diazo compound but the storage stability becomes low. The optimum amount of the diazo compound is about 40 to 8% by weight.

A stabilizer may be preferably added to the photosensitive composition. As the stabilizer, there can be used for example, zinc chloride, citric acid, 2-methoxy-4-hydroxy-5-benzoyl benzene sulfonate, phosphoric acid. The stabilizer is used in an amount of 0.1 to 4.0% by weight, preferably 0.5 to 2.5% by weight based on the total weight of the photosensitive composition.

The photosensitive composition of the present invention may be improved somewhat in abrasion resistance, developing characteristics and other properties by incorporating therein a water-insoluble resin containing hydrophilic groups, such as hydroxyl, amido or urethane groups. Examples of such resins are: polyester-polyols, polyurethanes, epoxy resins, polyvinyl formals, alkyd resins, phenolic resins, polyamides, polyimides resins, hydroxyalkyl acrylate or methacrylate copolymers as disclosed in the aforementioned Kita U.S. patent application Ser. No. 489,434 and the like. The most preferred of such resins are polyamides and polyurethanes. As the polyamides there are suitably used those soluble in e.g., methanol, ethanol, propanol, isopropanol, butanol, tert-butanol or like aliphatic alcohols; such as copolymeric polyamides of diamines, e.g, pentamethylenediamine, hexamethylenediamine, heptamethylenediamine, octamethylenediamine and C- and/or N-substituted derivatives thereof, with dicarboxylic acids, e.g. adipic acid, suberic acid, sebacic acid, dodecandicarboxylic acid and C-substituted derivatives thereof, and copolymeric polyamides derived from at least two lactams each having a 5- to -10-membered ring, e.g., butyrolactam. valerolactam, caprolactam, heptolactam and C-substituted derivatives thereof. Especially useful alcohol-soluble polyamides are those prepared by co-condensation of a mixture of a diamine, a dicarboxylic acid and a lactam, such as, e.g., copolyamides derived from hexamethylenediammonium adipate, hexamethylenediammonium sebacate and -caprolactam. As commercially avaoiable alcohol-soluble polyamides there may be mentioned: CM-4000 and - 8000 sold by Toray Inc., Zytel #63, Elvamide #8061, #8062 and #8063 sold by E. I. duPont de Nemours & Co., and Ultramid IC and 6A sold by Badische Aniline & Soda Fabrik A. G.

The polyurethane also is preferably soluble in solvents. Thus there can be used polyurethanes derived from a glycol, e.g., diethyleneglycol, triethylene glycol, polyethylene glycol, e.g., molecular weight 400, polypropylene glycol, poly(oxytetramethylene) glycol or polyester glycol, and a diisocyanate, e.g., toluene diisocyanate, xylylene diisocyanate, 4,4'-diphenylmethane diisocyanate, 4,4'-diphenylether diisocyanate, hydrogenated toluene diisocyanate, hydrogenated 4,4'-diphenylmethane diisocyanate, hexamethylene diisocyanate and lysine diisocyanate. The soluble polyisocyanate to be used in the present invention also can be prepared by addition of such a diisocyanate and glycol in a molar ratio of 1:1 to 1:2.

Although the polyamides and polyurethanes do not exhibit good compatibility with the aforesaid component (a) copolymer, they reduce the swelling of the image upon development and enhance the oleophilic properties of the image area on planographic printing plates when incorporated therewith. The polyamide or polyurethane may be incorporated in an amount of 6 to 100, preferably of 10 to 50% by weight based on the weight of the aforesaid component (a) copolymer. When incorporated in an amount above 100% by weight, the polyamide or polyurethane makes it difficult to develop the image by means of a weak aqueous alkali and reduces the storage stability of the photosensitive composition while in an amount less than 6% by weight the polyamide or polyurethane cannot exert any appreciable influence.

The photosensitive composition of the present invention can have incorporated therein, if desired, to improve certain properties, dye, pigment, stabilizer, plasticizer, loading filler or other conventional additive. Dyes which disclose the image area or react with the diazo compound are unsuitable for use as a dye for enhancing the visible contrast between the image area and the background in the finished printing plate. Examples of suitable dyes are e.g., Oil Blue #603 sold by Orient Kagaku Kogyo Kabushiki Kaisha, Eisen Spiron Blue GNH and Eisen Spiron Red 2BH sold by Hodogaya Kagaku Kogyo Kabushiki Kaisha, and Sapon Fast Fairly Red B sold by Badische Aniline & Soda Fabrik A.G. and other oil soluble dyes. The dye may be incorporated in an amount sufficient to impart a clear contrast between the color of the surface of the support and that of the image area, in general, the dye is used in an amount of at most about 7% by weight based on the total weight of the photosensitive composition and can be used in an amount as little as 0.5% when present.

The photosensitive composition of the present invention is suitable for use as a photosensitive layer of a presensitized planographic printing plate. Suitable supports for the plate includes paper, plastic film, such as polyvinyl acetate, sheet aluminum, copper, zinc, stainless steel surface-treated steel and like metallic sheets, and sheet glass. In general, before application of the coating composition to the surface of the support, the surface of the support is passivated for inhibiting harmful interaction between the surface and the diazo compound. The passivation, in addition, promotes a firm bonding between the exposed area of the coating and the support surface and enhances the hydrophilicity of the non-image area or bared support surface during printing step. The silicate treatment as disclosed in Jewett U.S. Pat. No. 2,714,066 is a preferred passivation treatment for metallic supports. The entire disclosure of Jewett is hereby incorporated by reference and relied upon. Other passivation processes are: treatment by an aqueous potassium fluorozirconate solution as disclosed in U.S. Pat. No. 2,946,683; treatment with phosphomolybdate as disclosed in Leonard U.S. Pat. No. 3,201,247; and electrodeposition of silicate as disclosed in Casson U.S. Pat. No. 3,658,662. The entire disclosures of U.S. Pat. No. 2,946,683, Leonard and Casson are hereby incorporated by reference and relied upon. There is known still another process in which an aluminum support is subjected to the aforesaid silicate treatment subsequent to anodic oxidation in phosphoric or sulfuric acid. The photosensitive composition of the present invention is applied in an amount of 0.1 to 5 $g/m^2$ to the support.

When exposed through a negative transparency to actinic light rays, the presensitized planographic plate prepared by using the photosensitive composition of the present invention undergoes a change in the exposed areas which results in a difference in the swelling property between the exposed areas and the unexposed areas. The development is performed by contacting the photosensitive layer with a developing solution consisting of a weak aqueous alkali. Suitable developing solutions include aqueous solutions having a pH of 7.5 to 12.5, preferably of 8 to 12, or inorganic alkalis, such as, e.g, sodium silicate, potassium silicate, sodium hydroxide, potassium hydroxide, lithium hydroxide, trisodium phosphate, disodium phosphate, triammonium phosphate, diammonium phosphate, sodium metasilicate, sodium bicarbonate and ammonia, and organic amine compounds, such as, e.g., monomethylamine, dimethylamine, trimethylamine, monoethylamine, diethylamine, triethylamine, monoisopropylamine, diisopropylamine, n-butylamines, monoethanolamine, diethanolamine, triethanolamine, monoisopropanolamine, diisopropanolamine, triisopropanolamine, ethyleneimine, ethylenediamine aniline and pyridine.

It is preferred to add to the aforesaid weak aqueous alkali an anionic surface active agent and an alcohol.

The anionic surface active agents include e.g., potassium rosinate, sodium oleate, potassium oleate, sodium stearate, sodium palmitate and like higher fatty acid salts; sodium isopropylnaphthalenesulfonate, sodium dodecylbenzenesulfonate and like alkylarylsulfonates; sodium laurylsulfate, ammonium laurylsulfate, sodium oleylsulfate, sodium xylylsulfate and like sulfate salts of aliphatic and aromatic alcohols; sodium alkylsulfonates, e.g., sodium decanesulfonate, monosodium N,N-dihydroxyethylglycinate, sodium poly(oxyethylene)sulfate, and sodium dialkylsulfosuccinates, e.g., sodium dioctyl sulfosuccinate. The surface active agent can be used in a concentration of 0.5 to 10, preferably 0.5 to 2% by weight based on the total weight of the developing solution.

The alcohols include, e.g., benzylalcohol, cyclohexanol, diacetone alcohol, 2-methoxyethanol, 2-ethoxyethanol, 2-butoxyethanol, isopropanol, n-butanol, sec-butanol, methanol, ethanol and 2-ethylhexanol, and they may be used in a concentration of 0.1 to 10, preferably 0.5 to 5%, by weight based on the total weight of the developing solution.

The concentration of the alkali can be between 0.05 and 5% by weight. Such concentration varies depending on the strength of its alkalinity and the desired value of pH. To the developing solution there may be added sodium nitrate, potassium nitrate, lithium nitrate or like nitrate in a concentration of 0.5 to 10% by weight based on the total weight of developing solution, to inhibit soiling of the bracket of the printing machine during printing. Among the aforesaid alkalis, sodium silicate is most preferred because of its additional function of inhibiting soiling of the bracket of the printing maching during printing.

The photosensitive composition of the present invention can be developed quickly by means of a weak aqueous alkali with ease because of the wide range of the optimum developing conditions, so called, developing latitude.

The photosensitive composition of the present invention may be used also as photoresist material and photomask.

Some embodiments of the present invention will be illustrated in more detail by the following examples in which all percentages are by weight.

EXAMPLE 1

300 g of dioxane was heated in a stream of nitrogen gas at 100° C., and a mixture of 150 g of 2-hydroxyethyl methacrylate, 60 g of acrylonitrile, 79.5 g of methyl methacrylate, 10.5 g of methacrylic acid and 1.2 g of benzoyl peroxide was dropped therein over 2 hours. 15 minutes after completion of the dropping there was added to the reaction mixture 300 g of dioxane and 0.3 g of benzoyl peroxide and the resulting mixture maintained under the reaction conditions for additional 4 hours. After completion of the reaction, the reaction mixture was diluted with methanol and poured into water to precipitate the copolymer formed. The precipitate was dried at 70° C in vacuo to obtain a 2-hydroxyethyl methacrylate copolymer (I) having an acid value of 20 and a viscosity, at 25° C. in 33% ethylene glycol monomethyl ether solution, of 3,500 cps.

A 0.15 mm thick 2S aluminum plate was degreased by soaking it for 3 minutes in a 10% aqueous trisodium phosphate solution maintained at 80° C, grained by means of a nylon brush, etched for about 90 seconds by sodium aluminate maintained at 60° C, and desmutted by a 3% aqueous sodium hydrogen sulfate solution. The aluminum plate was anodized in a 20% sulfuric acid for 2 minutes at a current density of 2 A/dm$^2$ and then treated for 1 minute with a 2.5% aqueous sodium silicate solution maintained at 70° C to make an anodized aluminum plate (I).

The aluminum plate (I) was coated with a photosensitive solution of the following recipe and dried at 100° C for 2 minutes.
Phososensitive solution:

| | |
|---|---|
| 2-Hydroxyethyl methacrylate copolymer (I) | 0.7 g |
| Polyurethane (I), 1/1 molar reaction product of toluene diisocyanate with triethylene glycol | 0.2 g |
| Tris-dichloropropyl phosphate | 0.1 g |
| 2-Methoxy-4-hydroxy-5-benzoylbenzenesulfonate of the condensate of p-diazodiphenylamine with paraformaldehyde | 0.1 g |
| Oil Blue # 603, sold by Orient Kagaku Kogyo Kabushiki Kaisha | 0.03 g |
| 2-Methoxyethanol | 6 g |
| Methanol | 6 g |
| Ethylene dichloride | 6 g |

The dried coating weight was 1.9 g/m$^2$. The presensitized planographic plate was exposed imagewise for 45 second to a 30 Amp. carbon arc lamp located 70 cm apart therefrom, then soaked at room temperature for 1 minute in a developing solution of the following recipe and lightly rubbed with degreased cotton to remove unexposed areas. In this manner there was obtained a planographic printing plate.
Developing solution:

| | |
|---|---|
| Benzyl alcohol | 15 g |
| 40 % Aqueous sodium silicate solution | 5 g |
| Sodium isopropylnaphthalenesulfonate | 5 g |
| Water | 975 g |

When the printing plate was put on a Heider GTO press, 100,000 or more sheets of high quality print could be obtained with a high quality paper.

The unexposed plate was stored at 45° C, 75% RH, for a week without any change in sensitivity. During printing the blancket was soiled little in non-image areas.

EXAMPLE 2

A 0.1 mm thick 2S aluminum plate was degreased by soaking for 3 minutes in a 10% aqueous trisodium phosphate solution maintained at 80° C, then washed with water, desmutted with 70% nitric acid, washed with water and soaked for 1 minute in a 3% aqueous sodium silicate solution to make a smooth, ungrained aluminum plate (II). The aluminum plate (II) was coated with the following photosensitive solution.
Photosensitive solution:

| | |
|---|---|
| 2-Hydroxyethyl methacrylate copolymer (I) | 0.67 g |
| Polyurethane (I) | 0.20 g |
| The same diazo resin as used in Example 1 | 0.10 g |
| Oil Blue # 603 | 0.02 g |
| Eisen Spyron Blue GNH, sold by Orient Kagaku Kogyo Kabushiki Kaisha | 0.01 g |
| 2-Methoxyethanol | 6 g |
| Methanol | 6 g |
| Ethylene dichloride | 6 g |

The dried coating weight was 1.4 g/m$^2$. The presensitized plate was exposed imagewise for 60 seconds by means of a Plano PS printer, manufactured by Fuji Photo Film Co., using a 3.5 Amp. metal halide lamp, and developed using the same developing solution as used in Example 1 to obtain a planographic printing plate. When the printing plate and another printing plate prepared in the same manner except that in the above photosensitive solution Polyurethane (I) 0.2 g was replaced by Ultramide IC, sold by Badische Aniline & Soda Fabrik A.G., 0.2 g and the dried coating weight was 1.5 g/m$^2$, were set in parallel on a Rhota printing press, manufactured by Rhota Co., Germany, and put on printing, the printing durability of the plate prepared using the Polyurethane (I) was higher by about 20 to 30% than that of the plate prepared using the Ultramide IC.

EXAMPLE 3

A polyurethane (II) with a free isocyanate value of 4.1 was prepared by reacting at 140° C for 2 hours in a stream of gaseous nitrogen 54 g (0.31 mole) of toluene diisocyanate and 30 g (0.20 mole) of triethylene glycol, adding thereto 26 g (0.20 mole) of 2-hydroxyethyl methacrylate containing 0.05% of 2,6-di-t-butylcresol as polymerization inhibitor and continuing the reaction at 80° C for additional 10 hours in a stream of gaseous nitrogen. The polyurethane (II) became a clear semi-solid of light yellow color when cooled to room temperature.

The same aluminum plate (I) as used in Example 1 was coated with the following photosensitive solution.
Photosensitive solution:

| | |
|---|---|
| 2-Hydroxyethyl methacrylate copolymer (I) | 0.7 g |
| Polyurethane (II) | 0.2 g |
| Diazo resin as used in Example 1 | 0.1 g |
| Oil Blue # 603 | 0.03 g |
| Methanol | 5 g |
| Ethylene dichloride | 5 g |
| 2-Methoxyethanol | 5 g |

The dried coating weight was 2.1 g/m². The presensitized planographic plate was exposed imagewise for 50 seconds to a 30 Amp. carbon arc lamp located 70 cm apart therefrom, then soaked at room temperature for 1 minute in the same developing solution as used in Example 1 and lightly rubbed by degreased cotton for removal of unexposed areas to obtain a planographic printing plate. For comparison, a similar photosensitive solution was prepared by omitting the polyurethane (II) and adding, instead thereof, the same amount of 2-hydroxyethyl methacrylate copolymer (I) and the solution was applied in the same weight to the same support to obtain another presensitized plate. The presensitized plate was also exposed and developed in the same manner. This comparison indicated that the presensitized plate prepared using the polyurethane resin could be developed more quickly and had a broader developing latitude than the latter plate.

EXAMPLE 4

A 0.15 mm thick aluminum plate was degreased by soaking for 3 minutes in a 10% aqueous trisodium phosphate solution maintained at 80° C, washed with water, desmutted by a 70% aqueous nitric acid, washed with water and then treated for 1 minute in 3% aqueous sodium silicate maintained at 70° C to make a smooth, ungrained aluminum plate (II). On the other hand, a 0.15 mm thick 2S aluminum plate was degreased in the same manner as mentioned above, then grained by means of a nylon brush, etched for about 10 seconds with sodium aluminate and desmutted with 3% aqueous sodium hydrogen sulfate. The aluminum plate was then anodized for 2 minutes in 20% aqueous sulfuric acid at an electric current density of 2 A/dm² and thereafter treated for 1 minute with a 2.5% sodium silicate solution to obtain an anodized aluminum plate (I).

Each of the two aluminum plates was coated with the following photosensitive solution and dried at 100° C for 2 minutes.
Photosensitive solution:

| | |
|---|---|
| 2-Hydroxyethyl methacrylate copolymer (I) | 7 g |
| Ultramid IC | 2 g |
| 2-Methoxy-4-hydroxy-5-benzoylbenzenesulfonate of the condensate of p-diazodiphenylamine with paraformaldehyde | 1 g |
| Tris-dichloropropyl phosphate | 1 g |
| Oil Blue # 603 | 0.3 g |
| 2-Methoxyethanol | 60 g |
| Methanol | 60 g |
| Ethylene dichloride | 60 g |

The dried coating weight was 1.35 g/m² in the case of the smooth aluminum plate (II) and 2.3 g/m² in the case of the anodized aluminum plate (I). The presensitized plates thus obtained were exposed imagewise to a 30 Amp. carbon arc lamp located 70 cm apart therefrom separately for 30 seconds, in the case of the smooth aluminum plate (II), and for 50 seconds, in the case of the anodized aluminum plate (I), then soaked for 1 minute in the following developing solution and lightly rubbed by degreased cotton for removal of unexposed areas to obtain planographic printing plates.
Developing solution:

| | |
|---|---|
| Benzyl alcohol | 15 g |
| 40 % Aqueous sodium silicate solution | 5 g |
| Sodium isopropylnaphthalenesulfonate | 5 g |
| Water | 975 g |

The printing plates were put on printing on a Heider GTO press using a high quality paper. For comparison, a planographic printing plate made by the specified process of "Plano Speed Coat" (SK), sold by Fuji Photo Film Co., comprising a smooth surfaced aluminum support and coated in image areas with an epoxy lacquer, and a planographic printing plate made by the specified process of "Photo Polymetic LN-L, sold by Eastman Kodak Co., in the United States, consisting of an anodized aluminum plate support and a photo-crosslinkable photosensitive material, the so-called high durable planographic printing plate, were subjected to a printing durability test. The results were summarized in the following Table 1.

TABLE 1
Durability Test by Means of Heider GTO Press

| No. | Printing Plate | No. of Printed Sheets | Soiling of Blanket in non-image area, During Printing |
|---|---|---|---|
| 1 | Smooth aluminum plate | 55,000 | No |
| 2 | Anodized aluminum plate | 170,000 | No |
| Control 1 | SK, sold by Fuji Photo Film Co., Smooth aluminum plate | 12,000 | No |
| Control 2 | LN-L, sold by Eastman Kodak Co. anodized aluminum plate | 85,000 | No |

As indicated by the above results, it was found that the photosensitive composition of the present invention provided a printing plate of very high durability when used as a photosensitive material for presensitized planographic printing plates. It also was found that the photosensitive material had excellent storage stability.

EXAMPLE 5

A 2-hydroxyethyl methacrylate copolymer (II) was prepared in the similar manner as in Example 1. The composition of the 2-hydroxyethyl methacrylate copolymer was: 2-hydroxyethyl methacrylate/acrylonitrile/methyl methacrylate/methacrylic acid = 60/10/27.5/2.5 in % by weight. Copolymer (II) had an acid value of 15 and a viscosity, at 25° C in 33% solution in ethylene glycol monomethyl ether, of 5,500 cps.

A silicate-treated, smooth-surfaced aluminum plate as used in Example 4 was coated with the following photosensitive solution.
Photosensitive solution:

| | |
|---|---|
| 2-Hydroxyethyl methacrylate copolymer (II) | 0.7 g |
| Ultramid ICC | 0.1 g |
| Diazo resin as used in Example 1 | 0.2 g |
| Oil Blue # 603 | 0.03 g |
| Tris-dichloropropyl phosphate | 0.1 g |
| 2-Methoxyethanol | 6 g |
| Methanol | 6 g |

-continued

| Ethylene dichloride | 6 g |

The dried coating weight was 1.5 g/m². The presensitized plate was exposed imagewise for 60 seconds to the same light source as used in Example 1 and developed using the same developing solution as used in Example 1 to obtain a planographic printing plate. The printing plate could be used on printing in the same manner as in Example 1.

EXAMPLE 6

A 2-hydroxyethyl methacrylate copolymer (III) was prepared in the same manner as in Example 1. The composition of the 2-hydroxyethyl methacrylate copolymer (III) was: 2-hydroxyethyl methacrylate/acrylonitrile/methyl methacrylate/acrylic acid = 50/20/26.5/3.5% by weight. The copolymer (III) had an acid value of 22 and a viscosity, at 25° C in 33% solution in dioxane, of 3,100 cps.

An anodized aluminum plate (I) as used in Example 4 was coated with the following photosensitive solution. Photosensitive solution:

| 2-Hydroxyethyl methacrylate copolymer (III) | 0.87 g |
| Diazo resin as used in Example 1 | 0.10 g |
| Tris-dichloropropyl phosphate | 0.10 g |
| Zinc chloride | 0.005 g |
| Oil Blue # 603 | 0.03 g |
| 2-Methoxyethanol | 6 g |
| Methanol | 6 g |
| Ethylene dichloride | 6 g |

The dried coating weight was 2.1 g/m². The presensitized plate thus obtained was exposed for 40 seconds to the same light source as used in Example 4 and developed using the same developing solution as used in Example 1 to obtain a planographic printing plate. Printing could be carried out using the printing plate as well as in Example 4, and the storage stability in the dark of the presensitized plate was somewhat better than that of the presensitized plate of Example 4.

EXAMPLE 7

A 2-hydroxyethyl methacrylate copolymver (IV) was prepared in the same manner as in Example 1. The 2-hydroxyethyl methacrylate copolymer (IV) had the composition 2-hydroxyethyl methacrylate/hydroxypropyl methacrylate/acrylonitrile/methyl methacrylate/methacrylic acid = 50/15/30/2/3% by weight, an acid value of 19 and a viscosity, at 25° C in 33% solution in dioxane, of 850 cps.

An anodized aluminum plate (I) as used in Example 4 was coated with the following photosensitive solution. Photosensitive solution:

| 2-Hydroxyethyl methacrylate copolymer (IV) | 0.87 g |
| Diazo resin as used in Example 1 | 0.10 g |
| Tris-dichloropropyl phosphate | 0.10 g |
| Oil Blue # 603 | 0.03 g |
| 2-Methoxyethanol | 6 g |
| Methanol | 6 g |
| Ethylene dichloride | 6 g |

The dried coating weight was 2.1 g/m². The presensitized plate thus obtained was exposed imagewise for 20 seconds to the same light source as used in Example 1, then soaked for 1 minute in the following developing solution and lightly rubbed by degreased cotton for removal of unexposed areas to obtain a planographic printing plate.
Developing solution:

| Benzyl alcohol | 10 g |
| 40 % Aqueous solution of sodium silicate | 20 g |
| Sodium isopropylnaphthalenesulfonate | 5 g |
| Sodium nitrate | 10 g |
| Water | 955 g |

The presensitized plate was developable by means of a developing solution having a low organic matter content.

EXAMPLE 8

A 2-hydroxyethyl methacrylate copolymer (V) was prepared. 300g of dioxane was heated in a stream of nitrogen gas at 100° C, 210g of 2-hydroxyethyl methacrylate, 30g of acrylonitrile, 60g of methyl methacrylate and 1.2g of benzoyl peroxide was dropped therein over 2 hours. 15 minutes after completion of the dropping there was added to the reaction mixture 315g of dioxane and 0.3g of benzoyl peroxide and the resulting mixture maintained the reaction conditions for additional 4 hours. After completion of the above polymerization reaction, there was added 50g of phthalic anhydride and 3.0g of triethylamine, and the half-esterification was performed at 100° C, for 2 hours. The reaction mixture was diluted with methanol and poured into water to precipitate the copolymer formed. The precipitate was dried at 40° C in vacuo to obtain a hydroxyethyl methacrylate copolymer (IV) having an acid value of 17 and a viscosity, at 25° C, in 33% ethylene glycol monomethyl ether solution, of 7,800cps.

An anodized aluminum plate (I) as used in Example 4 was coated with the following photosensitive solution. Photosensitive solution:

| 2-hydroxyethyl methacrylate copolymer (V) | 0.87g |
| Diazo resin as used in Example 1 | 0.10g |
| 85% phosphoric acid | 0.02g |
| Oil Blue #603 (Orient Kagaku Kogyo Kabushiki Kaisha) | 0.03g |
| 2-Methoxyethanol | 6g |
| Methanol | 6g |
| Ethylene dichloride | 6g |

The dried coating weight was 2.2g/m². The presensitized plate thus obtained was exposed for 40 seconds to the same light source as used in Example 4 and developed using the same developing solution as used in Example 1 to obtain a planographic printing plate. Printing could be carried out using the printing plate as well as in Example 1.

The products of the invention can comprise, consist essentially of or consist of the stated meterials.

What is claimed is:

1. A photosensitive composition suitable for use in a planographic printing plate consisting essentially of
    (a) a copolymer in which, on weight basis,
        (I) from 30 to 80% of the repeating structural units of said copolymer are represented by the general formula (I)

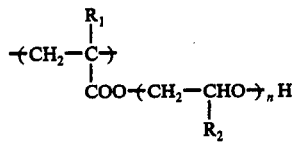

wherein $R_1$ is a hydrogen atom or methyl group, $R_2$ is a hydrogen atom, methyl, ethyl or chloromethyl group and $n$ is an integer of 1 to 10;

(2) from 5 to 60% of the repeating structural units of said copolymer are acrylonitrile units or methacrylonitrile of the units of the formula

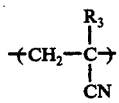

wherein $R_3$ is hydrogen or methyl;

(3) repeating structural units of said copolymer include alpha, beta ethylenically unsaturated carboxylic acid units or the half ester units of a cycle acid anhydride with I, the amount of (3) being sufficient so that said copolymer has an acid value of 10 to 100; and (4) from 64 to 0% of the repeating units of said copolymer are addition polymerizable ethylenically unsaturated compound units other than (1), (2), or (3), wherein said unsaturated compound is selected from the group consisting of acrylates, methacrylates, acrylamide, methacrylamide, allyl compounds, vinyl ethers, vinyl esters, styrenes or crotonates;

the viscosity of said copolymer being 1,000 to 20,000 cps as determined for a 33% by weight solution of said copolymer in ethylene glycol monomethyl ether at 25° C by means of a Brookfield rotational viscosimeter, and (b) a diazonium compound, said copolymer being 50 to 95% by weight of the total weight of (a) and (b), wherein said photosensitive composition, if unexposed to actinic light, is soluble in a weak aqueous alkaline solution and wherein said photosensitive composition is insoluble in said solution if said photosensitive composition is exposed to actinic light.

2. A composition according to claim 1, where said acid value ranges from 15 to 40.

3. A composition according to claim 1, wherein 30 to 80% by weight of said repeating units are copolymerized units of 2-hydroxy ethylmethacrylate.

4. A composition according to claim 1, wherein methacrylate acid is a comonomer in said copolymer and is present in an amount sufficient to result in said copolymer having said acid value.

5. A composition according to claim 1, wherein (b) is the 2-methoxy-4-hydroxy-5-benzoylbenzene sulfonate of the condensate of p-diazodi-phenylamine with paraformaldehyde.

6. A composition according to claim 1 in which the content of the copolymer (a) is 60 to 92% by weight and the content of the diazonium compound (b) is 40 to 8% by weight, based on the total weight of components (a) and (b).

7. A composition according to claim 1 in which the copolymer of 40 to 60% by weight of the compound represented by the above general Formula III, 40 to 10% by weight of acrylonitrile or methocrylonitrile, 49 to 10% by weight of the addition polymerizable unsaturated compound and the balance of the alpha-beta unsaturated carboxylic acid.

8. A composition according to claim 1 in which the copolymer is a copolymer of (1) 2-hydroxyethyl methacrylate or 2-hydroxypropyl methacrylate or mixtures thereof, (2) acrylonitrile, (3) methyl methacrylate and (4) acrylic acid methacrylic acid or mixtures thereof.

9. A composition according to claim 1 wherein (3) is an alpha, beta ethylenically unsaturated acid.

10. A composition according to claim 1 wherein (3) is said half ester of a cyclic acid anhydride, said acid anhydride being phthalic anhydride, tetrahydrophthalic anhydride, hexahydrophthalic anhydride, 3,6-endomethylene $\Delta^4$-tetrahydrophthalic anhydride, 3,6-endoxy - $\Delta^4$-tetrahydrophthalic anhydride, tetrachlorophthalic anhydride, maleic anhydride, chloromaleic anhydride, succinic anhydride or n-dodecyl succinic anhydride.

11. A composition according to claim 4, wherein said acid value ranges from 15 to 40.

12. A composition according to claim 3, wherein methacrylate acid is a comonomer in said copolymer.

13. A composition according to claim 12, wherein said acid value ranges from 15 to 40.

14. A composition according to claim 13, wherein 5 to 60% of said repeating structural units in said copolymer are acrylonitrile units.

15. A composition according to claim 14, wherein said unsaturated compound of (4) is a methacrylate.

16. A composition according to claim 15, wherein said methacrylate is methyl methacrylate.

17. A composition according to claim 8 in which the copolymer is of 40 to 60% by weight of the compound represented by the above general Formula III, 40 to 10% by weight of acrylonitrile or methacrylonitrile and 10 to 49% by weight of the addition polymerizable unsaturated compound and the balance of the cyclic acid anhydride.

18. A composition according to claim 7 in which the compound having the general Formula III is a 2-hydroxyalkyl acrylate or methacrylate wherein the alkyl contains 2 to 4 carbon atoms.

19. A composition according to claim 18 in which the compound having the general Formula III is 2-hydroxyethyl acrylate or methacrylate.

20. A composition according to claim 8 wherein the copolymer is a copolymer of 50 to 65% of (1), 10 to 30% of (2), 2 to 30% of (3) and 2.5 to 3.5% of (4).

21. A composition according to claim 9 wherein the alpha, beta ethylenically unsaturated acid is acrylic acid or methacrylic acid.

* * * * *